(12) United States Patent
Passlack et al.

(10) Patent No.: US 6,359,294 B1
(45) Date of Patent: *Mar. 19, 2002

(54) INSULATOR-COMPOUND SEMICONDUCTOR INTERFACE STRUCTURE

(75) Inventors: Matthias Passlack, Chandler; Jun Wang, Gilbert; Jonathan K. Abrokwah, Tempe; Zhiyi Jimmy Yu, Gilbert, all of AZ (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/812,952

(22) Filed: Mar. 4, 1997

(51) Int. Cl.[7] .......................... H01L 29/76; H01L 29/06; H01L 31/0328; H01L 31/0336
(52) U.S. Cl. .......................... 257/289; 257/14; 257/183; 257/192; 257/410; 257/411
(58) Field of Search ................................. 257/183, 289, 257/410, 411, 192, 114

(56) References Cited

U.S. PATENT DOCUMENTS

| 5,124,762 A | * | 6/1992 | Childs et al. | 257/289 |
| 5,334,865 A | * | 8/1994 | Fathimulla et al. | 257/289 |
| 5,597,768 A | * | 1/1997 | Passlack et al. | 437/236 |
| 5,747,838 A | * | 5/1998 | Mishra et al. | 257/289 |

OTHER PUBLICATIONS

"Low–Frequency Noise Characterization of n– and p–MOSFET's with Ultrathin Oxynitride Gate Films", P. Morfouli et al, IEEE Electron Device Letters, vol. 17, No. 8, Aug. 1996, pp. 395–397.

"Interface Traps In Jet–Vapor–Deposited Silicon Nitride–Silicon Capacitors", A. Mallik et al., 1996 American Institute of Physics, Appl. Phys. vol. 79 (11), Jun. 1, 1996, pp. 8507–8511.

"Thermodynamic and Photochemical Stability of Low Interface State Density $Ga_2O_3$–GaAs Structures Fabricated by In Situ Molecular Beam Epitaxy", M. Passlack et al., 1996 American Institute of Physics, Appl. Phys. Lett. vol. 69 (3), Jul. 15, 1996, pp. 302–304.

"Recombination Velocity at Oxide–GaAs Interfaces Fabricated by In Situ Molecular Beam Epitaxy", M. Passlack et al., 1996 American Institute of Physics, Appl. Phys. Lett. vol. 68 (25), Jun. 17, 1996, pp. 3605–3607.

"Quasistatic and High Frequency Capacitance–Voltage Characterization of $Ga_2O_3$–GaAs Structures Fabricated by In situ Molecular Beam Epitaxy", M. Passlack et al., 1996 American Institute of Physics, Appl. Phys. Lett. vol. 68 (8), Feb. 19, 1996, pp. 1099–1101.

"Growth, Characterization and the Limits of Ultrathin $SiO_2$–Based Dielectrics for Future CMOS Applications", D. Buchanan et al., The Electrochemical Society, Pennington, NJ, Proc. vol. 96–1, 1996, pp. 3–14.

"Characterization of the $SiO_2$/Si Interface Structure and the Dielectric Properties of $N_2O$–Oxynitrided Ultrathin $SiO_2$ Films", H. Fukuda et al., The Electrochemical Society, Pennington, NJ, Proc. vol. 96–1, 1996, pp. 15–27.

"Critical Processes for Ultrathin Gate Oxide Integrity", M. Depas, The Electrochemical Society, Pennington, NJ, Proc. vol. 96–1, 1996, pp. 352–366.

* cited by examiner

Primary Examiner—Steven Loke
(74) Attorney, Agent, or Firm—Eugene A. Parsons; Rennie William Dover; William E. Koch

(57) ABSTRACT

An insulator-compound semiconductor interface structure is disclosed including compound semiconductor material with a spacer layer of semiconductor material having a bandgap which is wider than the bandgap of the compound semiconductor material positioned on a surface of the compound semiconductor material and an insulating layer positioned on the spacer layer. Minimum and maximum thicknesses of the spacer layer are determined by the penetration of the carrier wave function into the spacer layer and by the desired device performance. In a specific embodiment, the interface structure is formed in a multi-wafer epitaxial production system including a transfer and load module with a III–V growth chamber attached and an insulator chamber attached.

7 Claims, 2 Drawing Sheets

FIG. 5 -PRIOR ART-
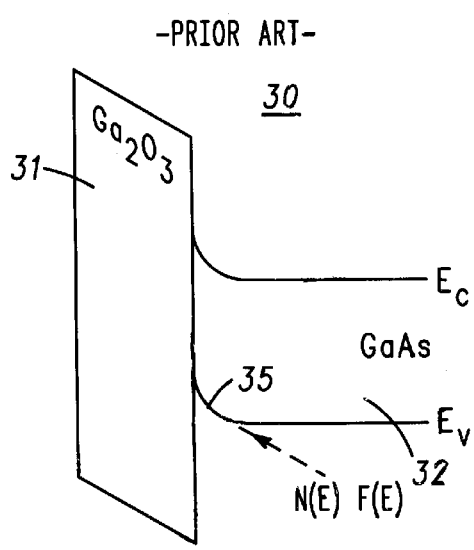
FIG. 6
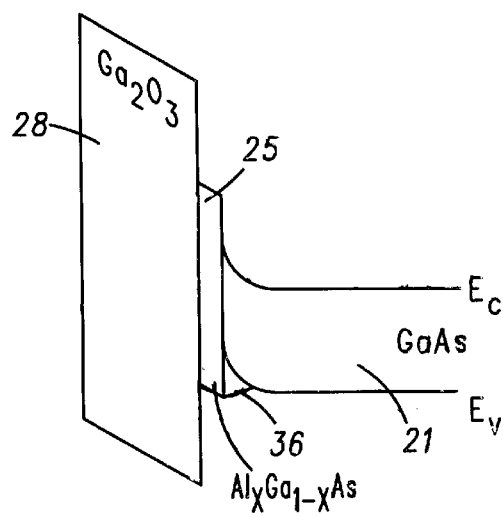
FIG. 7 -PRIOR ART-
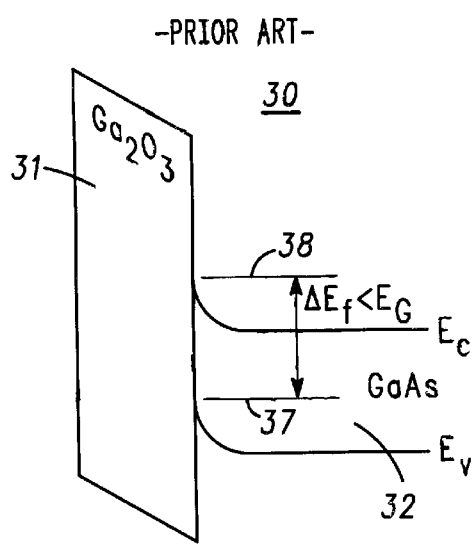
FIG. 8
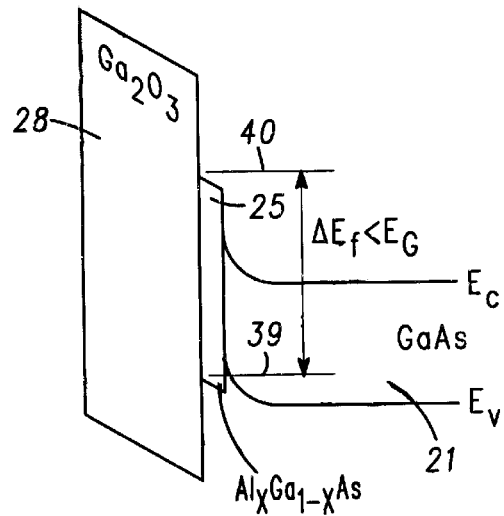
FIG. 9
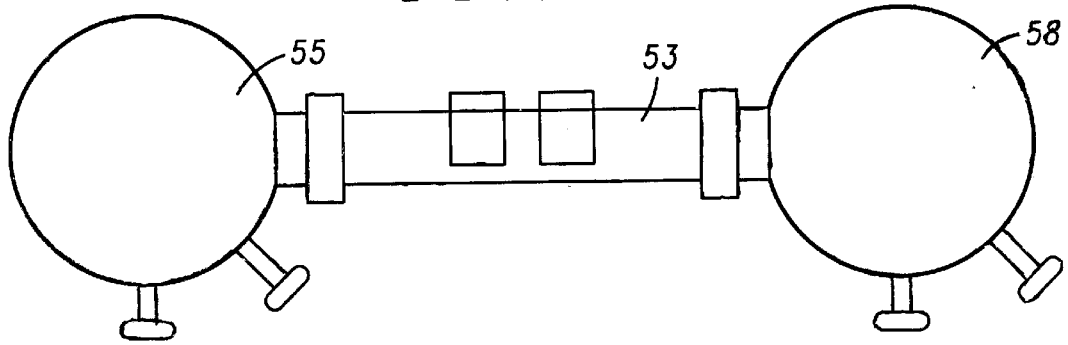

INSULATOR-COMPOUND SEMICONDUCTOR INTERFACE STRUCTURE

FIELD OF THE INVENTION

The present invention pertains to insulator-compound semiconductor interfaces and fabrication thereof and more specifically to insulator-compound semiconductor interfaces in semiconductor devices.

BACKGROUND OF THE INVENTION

Insulator-semiconductor interfaces are the workhorse of the semiconductor industry. Insulator and interface stability as well as reliability are affected by degradation of the insulator material and the insulator-semiconductor interface. For compound semiconductors, functional insulator III–V semiconductor interfaces are fabricated by in-situ deposition of a specific insulating layer (e.g. gallium oxide such as $Ga_2O_3$) on gallium arsenide (GaAs) based semiconductor epitaxial layers while maintaining an ultra-high vacuum (UHV). Full accessibility of the GaAs band gap and interface state densities in the low $10^{10}$ $cm^{-2}$ $eV^{-1}$ have been demonstrated. For compound semiconductors (e.g. GaAs), the remaining problems are associated with stability and reliability issues including carrier injection, charge trapping, and eventually, oxide degradation and breakdown. Trap densities as high as $2\times10^{12}$ $cm^{-2}$ have been found in e-beam deposited $Ga_2O_3$ films causing long term drift of device parameters in accumulation and inversion. See for instance, M. Passlack et al., Appl. Phys. Lett., vol 68, 1099 (1996), Appl. Phys. Lett., vol. 68, 3605 (1996), and Appl. Phys. Lett., vol 69, 302, (1996). One method of forming the specific insulating layer is described in U.S. Pat. No. 5,451,548, entitled "Electron beam Deposition of gallium oxide thin films using a single purity crystal layer", issued Sep. 19, 1995.

So far, insulator and interface stability and reliability have only been extensively investigated for the $SiO_2$—Si system. Degradation and damage were found to scale with the integrated flux of hot carriers (excluding the ultrathin oxide regime). Interface microroughness and defects facilitate localized injection of carriers from the substrate causing accelerated degradation. The degradation is further enhanced by weak or strained bonds, defects, contaminants, etc. located in the interfacial region which are preferred targets of degradation due to injected carriers. Eventually, damage induced by injected carriers causes breakdown of the insulator-semiconductor system. See for instance, D. A. Buchanan et al., Proc. Electrochemical Society, vol 96-1, p. 3; M. Depas et al., Proc. Electrochemical Society, vol. 96-1, p. 352. For Si technology, less degradation is achieved by sophisticated Si surface cleaning techniques and by replacing strained Si—O or weak Si—H interface bonds by stronger Si—N bonds at the insulator-semiconductor interface. See for instance, H. Fukuda et al. Proc. Electrochemical Society, vol. 96-1, P. 15; P. Morfouli et al., IEEE Electr. Dev, Lett., 17, 328 (1996); and A Malik et al., J. Appl. Phys., 79, 8507 (1996).

For compound semiconductors, the insulator-compound semiconductor structure is different and even more complex with respect to stability and reliability issues. Unlike thermal $SiO_2$, the specific insulating layer is fabricated by deposition on a semiconductor surface. Since charge trapping is more pronounced in the deposited layer than in the thermal $SiO_2$, additional stability and reliability problems arise. Further, the microroughness of a deposited insulator-compound semiconductor interface is typically inferior to the thermal oxide-Si interface. Unlike Si, the compound semiconductor surface is composed of at least two different types of surface atoms adding significant complexity to the atomic interfacial structure and extra potential sources for defects and weak bonds. The intentional replacement of specific atoms in specific bonds after fabrication of the interfacial structure appears to be an insurmountable task. Thus, prior art techniques applied to enhance stability and reliability in Si technology do not succeed for compound semiconductors.

Prior art III–V epitaxial wafer production employs a semiconductor layer to complete the epitaxial structure. Various semiconducting top layers are being used, for example GaAs, $In_{1-x}Ga_xAs$, $Al_{1-x}Ga_xAs$, InGaAsP, etc., depending on the specific device/circuit application and semiconductor substrate. The use of semiconducting top layers in prior art epitaxial wafer production results in uncontrollable and detrimental electrical and chemical surface properties. Electronic and optoelectronic device/circuit processing is complicated and device/circuit performance is affected. The degree of complication and degradation is subject to the particular device/circuit processing and application. For example, the fabrication and performance of unipolar transistor devices/circuits is hampered by plasma exposure, Fermi level pinning, and instability of the gate-source and gate-drain regions. The fabrication of functional and stable MOSFET devices has been impossible.

Uncontrollable and detrimental electrical and surface properties are caused by chemical surface reactions resulting in the formation of native oxides and dangling bonds. In turn, the surface is rendered thermodynamically unstable and exhibits a pinned Fermi level. Specifically, the high GaAs surface reactivity induces Fermi level pinning and surface instability after surface exposure as small as $10^3$ Langmuirs (1 Langmuir=$10^{-6}$ Torr). Surface preparation techniques conducted after exposure to air (sulfur, selenium, etc.) have proven to be inefficient and unstable.

Accordingly, it would be highly advantageous to provide new interfaces and methods of fabrication which overcome these problems.

It is a purpose of the present invention to provide a new and improved insulator-compound semiconductor interface structure.

It is another purpose of the present invention to provide a new and improved insulator-compound semiconductor interface structure with improved stability and reliability.

It is still another purpose of the present invention to provide a new and improved insulator-compound semiconductor interface structure which is relatively easy to fabricate and use.

It is yet another purpose of the present invention to provide a new and improved insulator-compound semiconductor interface structure which can be formed in situ to further reduce impurities and to further simplify fabrication.

It is a further purpose of the present invention to provide a new and improved insulator-compound semiconductor interface structure in which carrier density at the deposited insulator-compound semiconductor interface is orders of magnitude less than in the channel.

It is a still further purpose of the present invention to provide a new and improved insulator-compound semiconductor interface structure in which the probability of injecting hot carriers into the insulator is reduced by orders of magnitude.

It is yet a further purpose of the present invention to provide a new and improved insulator-compound semiconductor interface structure in which the effect of stress induced interface states located close to the semiconductor band edges is minimized.

It is still a further purpose of the present invention to provide a new and improved insulator-compound semiconductor interface structure in which effects of Coulomb scattering and interface roughness scattering are minimized for carriers in the inversion/accumulation channel.

SUMMARY OF THE INVENTION

The above problems and others are at least partially solved and the above purposes and others are realized in an insulator-compound semiconductor interface structure including compound semiconductor material with a spacer layer of semiconductor material having a bandgap which is wider than the bandgap of the compound semiconductor material positioned on a surface of the compound semiconductor material and an insulating layer positioned on the spacer layer. Minimum and maximum thicknesses of the spacer layer are determined by the penetration of the carrier wave function into the spacer layer and by the desired device performance.

In a specific embodiment, the interface structure is formed in a multi-wafer epitaxial production system including a transfer and load module with a III–V growth chamber attached and an insulator chamber attached.

BRIEF DESCRIPTION OF THE DRAWINGS

Referring to the drawings:

FIG. 5 is a bandgap diagram for a biased prior art interface illustrating substrate injection of hot carriers therein;

FIG. 6 is a bandgap diagram for a bias applied to the interface structure of FIG. 2 illustrating substrate injection of hot carriers therein;

FIG. 7 is a bandgap diagram for a biased prior art interface illustrating localized stress induced interfacial states therein;

FIG. 8 is a bandgap diagram for a bias applied to the interface structure of FIG. 2 illustrating localized stress induced interfacial states therein; and FIG. 9 illustrates a multi-wafer epitaxial production system utilized in fabricating the structure of FIG. 1 in accordance with the present invention.

DESCRIPTION OF THE PREFERRED EMBODIMENT

Figure 1:
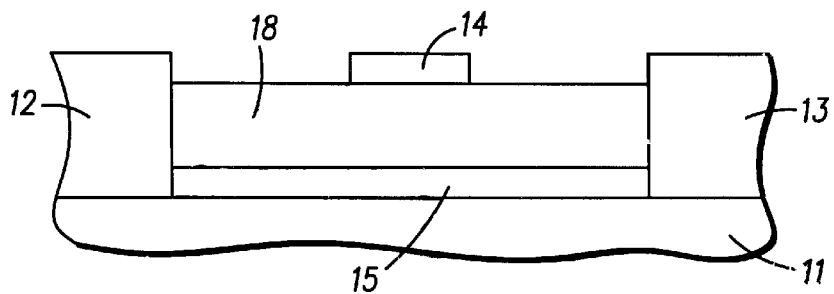
FIG. 1 is a simplified cross-sectional view of an insulator—compound semiconductor interface structure in a semiconductor device in accordance with the present invention.

Referring specifically to FIG. 1, a simplified cross-sectional view of an insulator—compound semiconductor interface structure 10 in a semiconductor device in accordance with the present invention is illustrated. Interface structure 10 includes a compound semiconductor substrate 11, such as any III–V material and any semiconductor device, represented herein by a source 12, a drain 13, and a gate 14 fabricated in/on substrate structure 11. Semiconductor substrate 11 generally includes a substrate and may include one or more layers of material (e.g. epitaxially grown layers) positioned thereon. A spacer layer 15 of semiconductor material having a bandgap which is wider than the bandgap of compound semiconductor substrate 11 is positioned on a surface of compound semiconductor substrate 11. Generally, spacer layer 15 is formed of a material which can be epitaxially grown on compound semiconductor substrate 11. For example, if compound semiconductor substrate 11 is gallium arsenide (GaAs), a material which can be conveniently used for spacer layer 15 includes $Al_xGa_{1-x}As$. An insulating layer 18 is then positioned on spacer layer 15, generally by deposition. Insulating layer 18 is most conveniently an oxide of one of the elements making up spacer layer 15. In this example, $Ga_2O_3$ is used for insulating layer 15 because of its ability to withstand high temperatures and its ease of production, however, it will be understood that other materials may be utilized in specific applications.

The insulating layer—spacer layer—compound semiconductor material for interface structure 10 are generally chosen from one of the following systems: $Ga_2O_3$—$Al_xGa_{1-x}As$—GaAs; $Ga_2O_3$—$Al_xGa_{1-x}As$—GaAs—$In_xGa_{1-x}As$; $Ga_2O_3$—$Al_xGa_{1-x}As$—$In_xGa_{1-x}As$; $Ga_2O_3$—$In_xGa_{1-x}P$—GaAs—$In_xGa_{1-x}As$, $Ga_2O_3$—$Al_{1-x}Ga_xAs$—GaAs, $Ga_2O_3$—$Al_xGa_{1-x}As$—$In_{1-x}Ga_xAs$ and mixtures of the systems. Spacer layer 15 has a thickness determined by penetration of a carrier wavefunction and performance of a device in which the insulator-compound semiconductor interface is used, as will be understood presently. Generally, spacer layer 15 has a thickness in a range of 1–5 nm.

Figure 2:
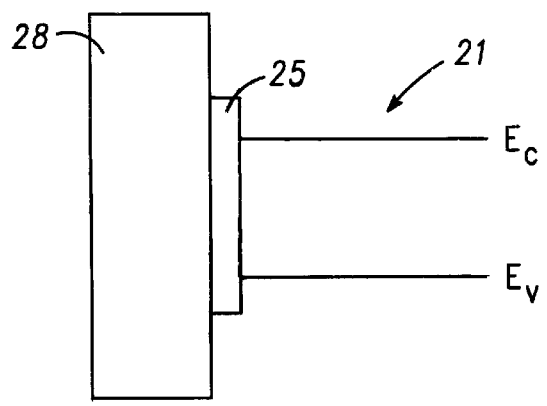
FIG. 2 is a bandgap diagram of the interface structure illustrated in FIG. 1.

Turning now to FIG. 2, a simplified bandgap diagram of interface structure 10 is illustrated. In the diagram, the conduction band is designated $E_c$ and the valence band is designated $E_v$. Also, the bandgap of compound semiconductor substrate 11, which in this specific example is GaAs, is illustrated as area 21 (hereinafter bandgap 21) at the right of the diagram. The bandgap of spacer layer 15, which in this specific example is $Al_xGa_{1-x}As$, is illustrated as area 25 (hereinafter bandgap 25) adjoins bandgap 21 of compound semiconductor substrate 11 at the left and is wider than bandgap 21. The bandgap of insulating layer 18, which in this specific example is $Ga_2O_3$, is illustrated as area 28 (hereinafter bandgap 8) adjoins bandgap 25 of spacer layer 15 at the left and is wider than bandgap 25.

Figure 3:
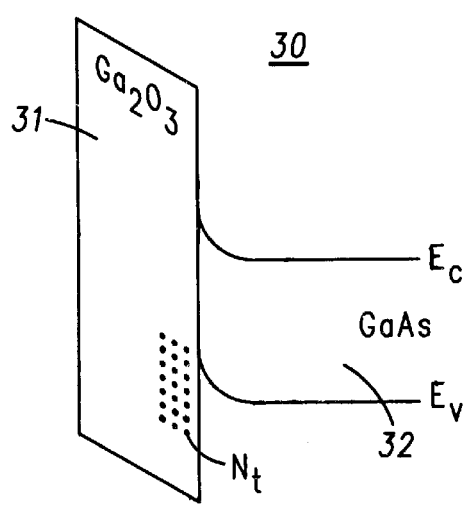
FIG. 3 is a bandgap diagram for a biased prior art interface illustrating insulator trapping centers and the trapping of carriers therein.

Interface structure 10 of FIG. 1 has several advantages which can best be explained with reference to bandgap diagrams of prior art structures compared to the bandgap diagram of interface structure 10. Referring to FIG. 3, a bandgap diagram is illustrated for a prior art interface 30 wherein an insulating layer of $Ga_2O_3$, represented by a bandgap 31, is deposited directly on the surface of a compound semiconductor material of GaAs, represented by a bandgap 32. The bandgap diagram of FIG. 3 is biased as it would be in normal operation and illustrates insulator trapping centers $N_t$ and the trapping of carriers therein. The trapping of carriers into insulator trapping centers $N_t$ occurs directly from the reservoir of inversion or accumulation carriers ($n_{2D} > 10^{12}$ cm$^{-2}$) located at the insulator-compound semiconductor interface.

Figure 4:
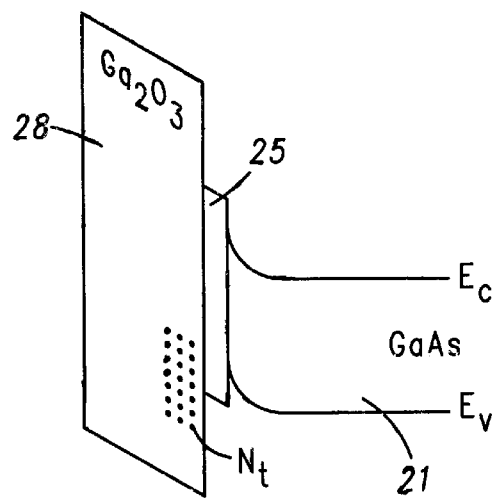
FIG. 4 is a bandgap diagram for a bias applied to the interface structure of FIG. 2 illustrating insulator trapping centers.

The bandgap diagram of FIG. 2 for interface structure 10, biased as it would be in normal operation, is illustrated in FIG. 4. The density of carriers available for trapping is reduced by orders of magnitude. For ultrathin spacer layer 15 ($Al_xGa_{1-x}As$) the tunneling probability, which exponentially depends on ΔE (the band offset at the interface of compound semiconductor substrate 11 and spacer layer 15) and Δx (the thickness of spacer layer 15), determines the density of carriers available for trapping processes. For thicker spacer layers, the density of carriers at the insulator-compound semiconductor interface is:

$$N_1 = n_{2D} e^{-\Delta E/kT}$$

For interface structure 10 the density does not exceed $N_1 = 10^8$ cm$^{-2}$ for an optimized design.

A second advantage of interface structure 10 is illustrated in FIGS. 5 and 6, which are bandgap diagrams similar to FIGS. 3 and 4. Referring to FIG. 5, a bandgap diagram is illustrated for prior art interface 30 wherein an insulating layer of Ga$_2$O$_3$, represented by bandgap 31, is deposited directly on the surface of a compound semiconductor material of GaAs, represented by a bandgap 32. The bandgap diagram of FIG. 5 is biased as it would be in normal operation and illustrates the substrate injection of hot carriers from the inversion/accumulation channel into the insulating layer (bandgap 31). The bandgap diagram of FIG. 6 represents the structure of FIG. 1 and the various bandgaps are numbered the same as in FIG. 4. A distribution curve N(E)F(E) in FIG. 5 indicates the distribution of carriers adjacent the interface of the compound semiconductor material and the insulating layer where carriers below dashed line 35 (quantum well ground state) can contribute.

A distribution curve N(E)F(E) in FIG. 6 indicates the distribution of carriers adjacent the compound semiconductor substrate 11 and spacer layer 15 where only carriers below dashed line 36 can contribute. Here N(E), F(E), and E are the density of states, the Fermi-Dirac distribution function, and the energy, respectively. As can be seen from FIG. 6, very few hot carriers are available for injection in interface structure 10 and, therefore, the substrate injection of hot carriers into insulator layer 18 (bandgap 28) is drastically reduced. Here it should be noted that the microroughness and defects inherent in a deposited layer are between insulating layer 18 and spacer layer 15, whereas the interface between spacer layer 15 and compound semiconductor layer 11 is smooth and defect free because spacer layer 15 is grown on the surface of compound semiconductor substrate 11.

Another advantage of interface structure 10 is illustrated in FIGS. 7 and 8, in which bandgap diagrams similar to FIGS. 3 and 4, respectively, are illustrated and similar bandgaps are designated with similar numbers. Referring specifically to FIG. 4, localized, stress induced interfacial states are located in bandgap 32 of the compound semiconductor in which the inversion/accumulation channel forms. That is, $\Delta E_f < E_G$, as illustrated by dotted lines 37 and 38, where $\Delta E_f$ is the energy range of free Fermi level movement and $E_G$ is the bandgap between $E_c$ and $E_v$. In interface structure 10, represented by FIG. 8, localized, stress induced interfacial states are removed from the bandgap of the compound semiconductor material in which the conducting channel forms (material 11) by using wide bandgap semiconductor material 15 inserted between the deposited insulator layer 18 and compound semiconductor substrate 11 in which the inversion/accumulation channel forms. That is, $\Delta E_f > E_G$, as illustrated by dotted lines 39 and 40. This advantage enables the implementation of inversion/accumulation mode devices on compound semiconductors.

Turning now to FIG. 9, a multi-wafer epitaxial production system 50 is illustrated, which is utilized in fabricating interface structure 10 of FIG. 1 in accordance with the present invention. System 50 includes a transfer and load module 53, a III–V growth chamber 55 attached to transfer and load module 53, and an insulator chamber 58 attached to transfer and load module 53. Each of chambers 55 and 58 are attached to transfer and load module 53 so that wafers, chips, etc. can be processed in each chamber without removing the wafers from the system.

Thus, as an example of a process of fabricating an insulator-compound semiconductor interface structure in accordance with the present invention, a compound semiconductor substrate is placed in transfer and load module 53 and the pressure in multi-wafer production system 50 is reduced to $\leq 10^{-10}$ Torr. The compound semiconductor substrate is then moved to III–V growth chamber 55 and a compound semiconductor epitaxial layer (e.g. material 11 of FIG. 1) and a spacer layer of compound semiconductor material (e.g. spacer layer 15 of FIG. 1) having a bandgap which is wider than the bandgap of compound semiconductor substrate 11 are epitaxially grown on the compound semiconductor substrate. After the growth of spacer layer 15, compound semiconductor substrate 11 is moved to transfer and load module 53 and then to insulator chamber 58. In insulator chamber 58, an insulating layer (e.g. insulating layer 18 of FIG. 1) is deposited on spacer layer 15.

Thus, a new and improved insulator-compound semiconductor interface structure is disclosed along with novel methods of fabrication. The new and improved insulator-compound semiconductor interface structure has improved stability and reliability and is relatively easy to fabricate and use. Also, the new and improved insulator-compound semiconductor interface structure can be formed in situ to further reduce impurities and to further simplify fabrication. Some advantage of the new and improved insulator-compound semiconductor interface structure are that carrier density at the deposited insulator-compound semiconductor interface is orders of magnitude less than in the channel, the probability of injecting hot carriers into the insulator is reduced by orders of magnitude, and the effect of stress induced interface states located close to the semiconductor band edges is minimized. Also, the effects of Coulomb scattering and interface roughness scattering are minimized for carriers in the inversion/accumulation channel, which enables the implementation of high performance inversion/accumulation mode devices on compound semiconductors.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An oxide-compound semiconductor interface structure on a gallium arsenide (GaAs) based substrate, comprising:

the gallium arsenide based substrate having a major surface with a surface bandgap;

an $In_xGa_{1-x}P$ spacer layer disposed on the major surface of the GaAs based substrate and having a bandgap of the GaAs based substrate, the spacer layer having a surface; and a gallium oxide based insulating layer deposited on the surface of the $In_xGa_{1-x}P$ spacer layer and having a bandgap which is wider than the bandgap of the $In_xGa_{1-x}P$ spacer layer.

2. An oxide-compound semiconductor interface structure as claimed in claim 1 wherein the GaAs based substrate includes a GaAs epitaxial layer positioned thereon.

3. An oxide-compound semiconductor interface structure as claimed in claim 1 wherein the gallium oxide based insulating layer includes gallium oxide ($Ga_2O_3$).

4. An oxide-compound semiconductor interface structure as claimed in claim 1 wherein the GaAs based substrate includes an $In_xGa_{1-x}As$ epitaxial layer positioned thereon.

5. An oxide-compound semiconductor interface structure as claimed in claim 1 wherein the compound semiconductor interface structure is included in a semiconductor device.

6. An oxide-compound semiconductor interface structure as claimed in claim 5 wherein the semiconductor device is an inversion/accumulation mode device.

7. An oxide-compound semiconductor interface structure as claimed in claim 1 wherein the GaAs based substrate includes $In_xGa_{1-x}As$ and GaAs epitaxial layers positioned thereon.

* * * * *